Sept. 20, 1960 J. P. ECKERT, JR., ET AL 2,953,692
AMPLIFIER DEVICES
Filed May 13, 1955 2 Sheets-Sheet 1
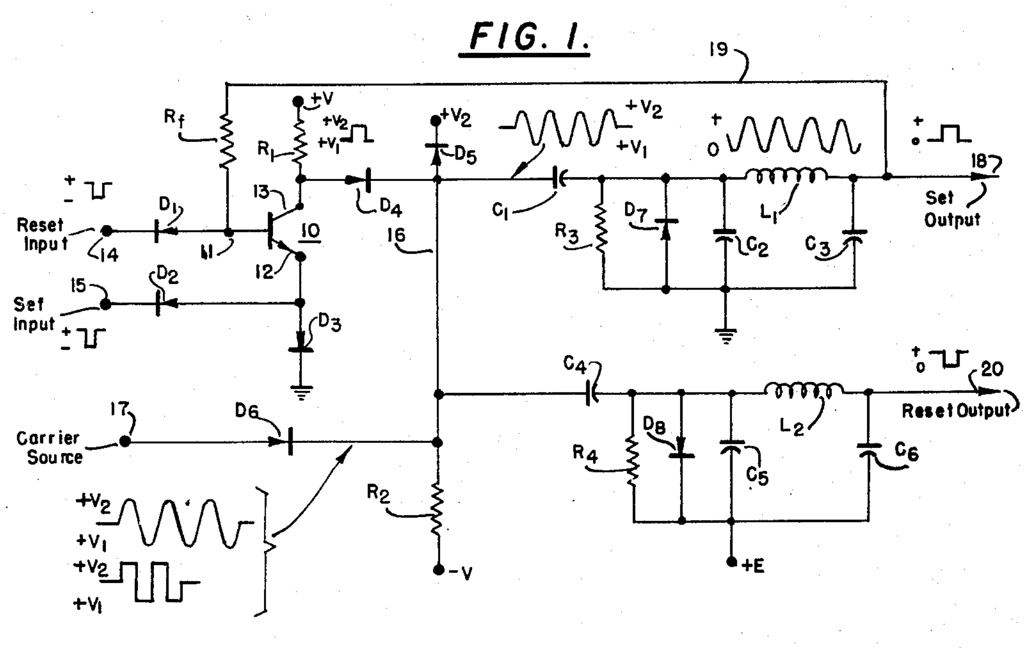
FIG. 1.
FIG. 2.
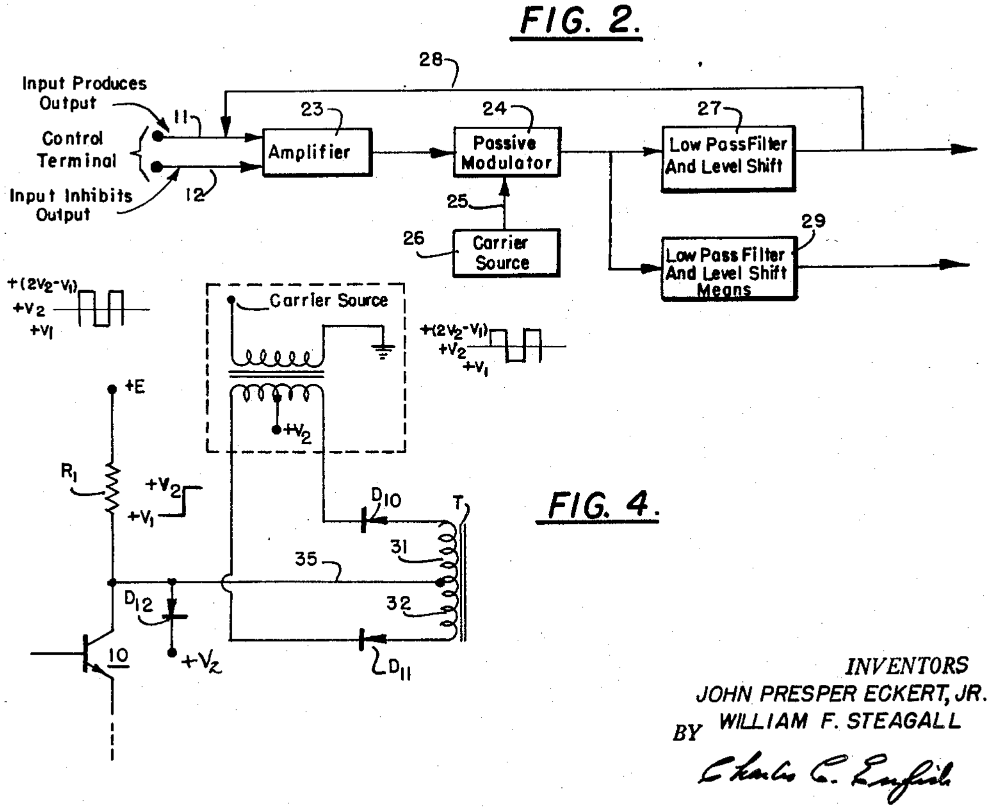
FIG. 2, FIG. 4.
INVENTORS
JOHN PRESPER ECKERT, JR.
BY WILLIAM F. STEAGALL
Charles C. Englis
AGENT

AMPLIFIER DEVICES

Filed May 13, 1955

INVENTORS
JOHN PRESPER ECKERT, JR.
WILLIAM F. STEAGALL
BY Charles C. Englis
AGENT

United States Patent Office 2,953,692

Patented Sept. 20, 1960

2,953,692

AMPLIFIER DEVICES

John Presper Eckert, Jr., Philadelphia, Pa., and William F. Steagall, Merchantville, N.J., assignors, by mesne assignments, to Sperry Rand Corporation, New York, N.Y., a corporation of Delaware Filed May 13, 1955, Ser. No. 508,098

9 Claims. (Cl. 307—88.5)

The present invention relates to amplifier circuits and is more particularly concerned with novel circuits employing such amplifiers in combination with passive modulators to effect desired operational characteristics. In one form of the present invention the amplifier may comprise a transistor, and the circuit may be arranged to exhibit at least two stable states of operation.

The transistors are presently employed in a number if applications, and more particularly in those applications wherein it is desired to achieve a relatively large voltage gain. Certain of these transistor circuits are selectively energized by signal sources and by a carrier frequency substantially higher than that of the signal sources. To assure optimum operation of such devices, it is desirable to keep carrier frequency potentials out of the transistor or transistors utilized, and the present invention is particularly concerned with novel circuits avoiding the necessity of transistor operation at frequencies higher than a given signal input frequency. In a broader sense, however, the present invention is concerned with, and discloses various amplifier circuits, particularly in combination with passive modulator means, whereby carrier frequency potentials may be excluded from the amplifier itself. In this respect, therefore, it must be understood that the present invention is not limited to transistor circuits, per se, and is not limited to amplifier devices exhibiting bistable operation.

The present invention, in accordance with the foregoing desired characteristics, therefore, provides amplifier devices capable, in one form thereof, of providing bipolar outputs. Such devices may utilize but a single transistor, and that transistor need not operate at a frequency higher than the signal input frequency. In operation, the bistable form of the present invention is characterized by the selective provision if two stable states which may be provided as characteristic outputs at a single output terminal, or which may be characterized by a unique combination of potentials at a pair of output terminals; and transitions between the said stable states are accomplished by application of input pulses, for instance to selected electrodes of a transistor. In providing such bistable outputs, the said input pulses may be coupled to the transistor itself whereby the operating state of the said transistor determines the potential level of an output line coupled thereto. A source of carrier frequency may in turn be coupled to the said output line whereby the said carrier potentials are selectively passed or prevented from passing to further circuit elements providing the ultimate output of the system and also providing locking feedback to the transistor.

In a preferred embodiment of the present invention, and as will become apparent from the subsequent description, these further circuit elements may comprise a passive modulator and a level shifting circuit; and filter means may in turn be coupled to the said modulator to provide the aforementioned locking feedback having carrier frequency components eliminated therefrom. By this novel combination of transistor (or other amplifier), passive modulator, and level shifting circuit, therefore, a novel amplifier device which is relatively inexpensive, which exhibits considerable ruggedness and which has highly desirable operating characteristics, is achieved.

It is accordingly an object of the present invention to provide novel amplifier devices.

A further object of the present invention resides in the provision of novel amplifier devices employing transistors.

A still further object of the present invention resides in the provision of a bistable device which is more rugged in configuration and less subject to operating failures than has been the case heretofore.

Another object of the present invention resides in the provision of a bistable device employing a single transistor.

A still further object of the present invention resides in the provision of an amplifier circuit in conjunction with signal and carrier frequency sources so arranged that said amplifier is not required to operate at frequencies higher than the signal frequency.

A still further object of the present invention resides in the provision of a transistor bistable device, the stable states of which are characterized by bipolar outputs.

The foregoing objects, advantages, construction and operation of the present invention will become more readily apparent from the following description and accompanying drawings, in which:

Figure 1 is a circuit diagram of a bistable device constructed in accordance with the present invention;

Figure 2 is a block diagram of a generic form of the present invention arranged in accordance with the schematic of Figure 1;

Figure 4 is a still further modification in accordance with the present invention.

Figure 3:
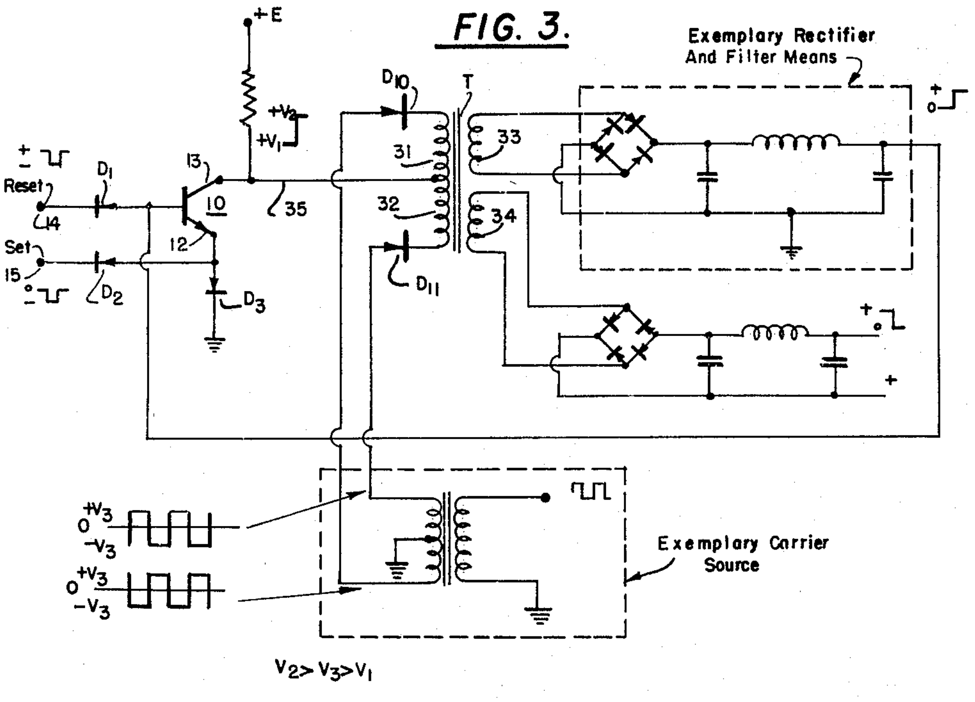
Figure 3 is a modified amplifier circuit in accordance with the present invention.

Referring now to Figure 1, it will be seen that a bistable device in accordance with the present invention may comprise a transistor 10 having a base electrode 11, an emitter electrode 12, and a collector electrode 13. "Reset" inputs, which may comprise a negative-going pulse from an original positive base level, may be selectively applied to the said base electrode 11 via reset input terminal 14 and a rectifier D1. "Set" input signals, having substantially the same configuration as that described in reference to the reset inputs, may in turn be selectively coupled to the emitter electrode 12 via a set input terminal 15 and a rectifier D2; and a clamp rectifier D3 is coupled from the said emitter electrode 12 to ground, as shown. The collector electrode 13 is coupled to a source of positive potential +V by a resistor R1 and is further coupled to a line 16 via a rectifier D4 whereby the potential level of the said line 16 is selectively responsive to the operating state of the transistor 10. A further rectifier D5 is also coupled between the said line 16 and a source of positive potential $+V_2$, as shown, thereby to prevent the potential of line 16 from rising above $+V_2$. The arrangement shown, comprising rectifier D4, D5 and D6, and resistor R1 and R2, comprises a passive modulator having a first input (from the transistor 10) via rectifier D4, and having a second input (from a carrier source 17) via rectifier D6.

The source of alternating carrier potential 17, which may be either sinusoidal, square wave, or of other alternating configuration between upper and lower potential levels of $+V_2$ and $+V_1$, is coupled to line 16 via a terminal 17 and rectifier D6, the cathode of the said rectifier D6 being returned to a source of negative potential $-V$, via a resistor R2, thereby to assure conduction of the said rectifier D6 for applied carrier potentials. Carrier potentials appearing at the terminal 17 are selectively coupled via a capacitor C1 dependent upon the potential level of the said line 16, and the capacitor C1 in turn serves to remove the D.C. components of the carrier from signals fed to the further circuits shown, thereby shifting the potential level of signals so fed to said further circuits.

Alternating potentials thus passing through the capacitor C1 are applied to a base potential determining circuit (or D.C. restoring circuit) comprising a rectifier D7, the anode of which is returned to ground, and a resistance R3, whereby the potential at the cathode of D7 is limited to a least value of zero, and the applied carrier potential appearing selectively on line 16 has its base level shifted from $+V_1$ to zero volts. This positive-going carrier signal is then filtered by a suitable low-pass filter, illustrated here by the circuit comprising the inductance $L_1$ and the capacitors C2 and C3, whereby a substantially D.C. output appears at the set output terminal 18; and this output may in turn be fed back via a line 19 and current limiting resistor means R*f* to the base electrode 11 of the transistor 10.

As will appear subsequently, the above described portion of the circuit shown in Figure 1 will operate in a manner characterized by the provision of two possible stable potential outputs at the set output terminal 18 in response to the application of set and reset input signals at the terminals 15 and 14. In accordance with a modification of the present invention, however, a further reset output may be obtained, characterized by two further stable potential levels, the said levels being so related that a zero level "set" output has a corresponding positive level "reset" output, and vice versa. This additional reset output may be effected by coupling signals appearing on the line 16 via a capacitor C4 to a further reference potential determining circuit utilizing a rectifier D8 and a resistor R4; and the cathode of the said rectifier D8 is returned to a source of positive potential +E, as shown, whereby the maximum potential at the anode of D8 is +E. The output of this further level determining circuit R4—D8 may once more be coupled to a reset output terminal 20 via a filter $L_2$—$C_5$—$C_6$ functioning in the manner described above.

Discussing the operation, therefore, let us initially assume that the device of Figure 1 is in the reset state and that no reset or set inputs are applied to the terminals 14 and 15. Under this initial state of operation, the collector electrode 13 of transistor 10 will pass no substantial current, whereby the potential source +V (which is more positive than $+V_2$) maintains the anode of rectifier D4 and the line 16 at a potential substantially $+V_2$. Carrier signals appearing at the terminal 17, therefore, will not be coupled via the line 16, and the capacitor C1, to the filter $L_1$—$C_2$—$C_3$ connected to the said capacitor C1 inasmuch as the maximum carrier potential is $+V_2$. The set output terminal 18 will, therefore, have a potential of substantially zero volts. If now a set input pulse, which is negative-going, as shown, is applied to the set input terminal 15, the collector electrode 13 will draw current, reducing the potential of the said collector electrode 13 to a small value, whereby rectifier D4 is substantially disconnected and the potential of line 16 varies in accordance with the carrier source potential. The carrier potentials coupled to the line 16 at the terminal 17 will pass through the capacitor C1 and will appear at the input to the low-pass filter $L_1$—$C_2$—$C_3$ as a series of positive-going pulses from a base level of zero volts. These positive-going pulses may then be filtered by the said filter, whereby the set output terminal 18 rises to a substantially steady positive potential; and this positive potential is further coupled via the line 19 and current limiting means R*f* to the base electrode 11 of the transistor 10 to maintain the collector electrode 13 at its reduced potential condition. The feedback via the connection 19 is regenerative and the gain of the transistor is greater than one and sufficient to maintain the circuit in the stable set condition. Thus, the application of a set input pulse at the terminal 15 causes the circuit to assume a stable state characterized by a positive potential output at the set output terminal 18.

If now a reset input pulse, which is negative-going from an original positive base level, should be applied to the reset input terminal 14, the potential of the collector electrode 13 will rise to its original positive potential $+V_2$, whereupon rectifiers D4 and D5 conduct, preventing further potential rise, and carrier waves are prevented from passing toward the set output terminal 18. This set output terminal 18 thus reverts to a zero potential level and this zero level, being coupled to the base electrode 11 of the transistor 10 via the line 19, maintains the device in its second stable state.

The operation of the further reset output circuit discussed above is analogous to that described in reference to the set output. Inasmuch, however, as the rectifier D8, employed in the reference potential determining circuit of the reset output circuit, is oppositely poled to that of rectifier D7 with respect to its respective coupling capacitor; and inasmuch further as the cathode of the said rectifier D8 is returned to a positive potential +E, the reset output appearing at terminal 20 is characterized by a potential level opposite to that of the set output 18 for the various operating conditions described above. Thus, this reset output is characterized by two further stable potential outputs responsive to the application of signal inputs at the set and reset input terminals 15 and 14.

It will be noted that although a relatively high frequency carrier source is employed in the provision of the above described bistable device, the transistor 10 is at no time required to amplify or respond to carrier frequencies. In addition, the circuit effects the desired bistable operation while utilizing but a single transistor and does not require expensive and bulky components such as transformers in effecting this operation.

Referring now to Figure 2, it will be seen that, in its broader aspects, the amplifier device thus far described comprises an amplifier 23 having a pair of inputs 11 and 12 and having an output; a passive modulator 24 having a control input connected to the output of said amplifier 23, the said passive modulator also including carrier input means 25 connected to a source 26 of alternating carrier potential. Output means 27 (and, if desired, output means 29) are also provided for shifting the D.C. level of the output of passive modulator 24. As will become apparent from the following discussion, such D.C. level shifting means as may be present in element 27 (or 29) can be omitted in certain cases. Element 27 (or 29) preferably includes filter means for selectively reducing the carrier frequency components present in the output of the passive modulator 24, or of said level shifting means, when employed.

The device of Figure 2, which is basically a novel amplifier, is operated as a bistable device (as discussed in reference to Figure 1), by means of a feedback path such as 28. Let us now consider, however, the operation of a device such as has been shown in Figures 1 and 2, in the absence of the aforementioned feedback connection. If, in such circumstance, an input should be applied to the amplifier 23 (or 10), via input terminal 11, an output will be produced from the said amplifier; and under the control of said output, the passive modulator 24 will transmit a carrier frequency signal from source 26 (or 17) to the input of the low-pass filter means 27 and the aforesaid optional D.C. level shifting means, whereby the signal frequency components of said carrier frequency signal appear at the output of said low-pass filter means. Thus, in the absence of any feedback connection, an output signal will appear at the output of the low-pass filter means 27 in response to an input via terminal 11. It will be apparent that bistable operation results if the output of the low-pass filter means 27 is returned to input terminal 11; but in the absence of such feedback, the circuit still operates as an amplifier device having the highly desirable characteristic that carrier frequencies are excluded from the amplifier portion of the circuit.

An additional input terminal 12 is optionally provided for use as an amplifier output inhibition means. It functions, as has been discussed, to effectively cancel the effect of an input via terminal 11. Thus input terminal 12 is effectively used to open the feedback circuit, if such should be provided, when the device of Figure 2 is arranged for bistable operation. The low-pass filter and level shift means 29, shown by a connection in Figure 2, may be provided to effect a second output terminal, from which signals of polarity opposite to those available at the output of means 27 may be taken.

A further embodiment, in accordance with the present invention, has been shown in Figure 3. It will be seen that the amplifier used is again a transistor and that it is connected in substantially the same fashion as the embodiment of Figure 1. In this respect, therefore, like components have been given like numerals in Figure 3. However, instead of employing the passive modulator D4—D5—D6—R1—R2 discussed in Figure 1, the passive modulator of Figure 3 comprises a pair of rectifiers D10 and D11 connected as shown to a transformer T.

Referring to the several waveforms illustrated in Figure 3, it will be seen that if transistor 10 (of Figure 3) is conducting so that the collector 13 is at $+V_1$, current will flow in rectifiers D10 and D11 and their respective complementary transformer windings 31 and 32, in response to the application of positive pulses of carrier potential to the respective anodes of D10 and D11. The potential induced in transformer secondary 33, in response to such current flow, may be rectified and filtered by the means shown. If, on the other hand, the transistor 10 (of Figure 3) should be non-conducting so that the collector 13 thereof is at the potential $+V_2$, greater than the maximum potential of the carrier input, rectifiers D10 and D11 will be biased off and no substantial current will flow in transformer primary windings 31 and 32. A further secondary winding 34 may be provided in order to obtain bipolar output signals.

In the embodiment of Figure 3, the carrier path is via rectifier D10 and winding 31, or via rectifier D11 and winding 32, and thence via wire 35, collector 13, emitter 12, and rectifier D3, to ground. It will be seen that when the transistor is conducting, such current flow is substantially continuous and the transistor 10 is not required to produce gain at the carrier frequency. Further, it is not necessary that the current should flow in this particular path; and in Figure 4 yet another embodiment is indicated in which a quite different current path is followed by the carrier current.

Referring now to Figure 4, it will be seen that the arrangement shown therein is in part identical with the embodiment of Figure 3; and for convenience, only the differing portion has been presented. In the arrangement of Figure 4, this further embodiment differs from that of Figure 3 in that rectifiers D10 and D11 are connected with opposite polarity in respect to those of Figure 3. In addition, a clamping rectifier D12, having its anode connected to line 35, is provided; and the function of the said rectifier D12 is to limit the maximum potential on line 35 to the potential $+V_2$ (to which potential the cathode of rectifier D12 is returned). The arrangement of Figure 4 also differs from those already discussed in respect to the peak-to-peak potentials between which the carrier input alternates, and these potentials have been shown in the arrangement of Figure 4.

The operation of the device of Figure 4 thus differs from that of Figure 3 in that when the transistor 10 is nonconducting, line 35 will be at $+V_2$, and current will flow alternately in the paths +E—R1—35—31—D10; and +E—R1—35—32—D11, in response to the application of carrier frequency potential pulses to the cathodes of rectifiers D10 and D11, respectively. In addition to funcitoning as an energy source for the operation of transistor 10, the source +E, in combination with resistor R1 and rectifier D12, further acts to maintain the line 35 at a $+V_2$ potential in the presence of the current flow described above. Hence, the transistor 10 is once more not required to respond to carrier frequency current. It will be apparent that when transistor 10 is conducting and line 35 is at $+V_1$, no substantial current can flow in windings 31 and 32 of transformer T.

It will be noted that when carrier frequency current flows in, for instance winding 31, potential will be induced in winding 32. Such induced potentials preferably should be prevented from producing current flow; and to achieve this purpose the carrier potential applied to the cathode of the rectifier through which no current is desired, is caused to rise to a potential sufficient to bias off the last-named rectifier. In this case, it will be seen that this current blocking potential must be not less than $+(2V_2-V_1)$ volts. Similar but not identical considerations apply to the device of Figure 3.

Figure 5:
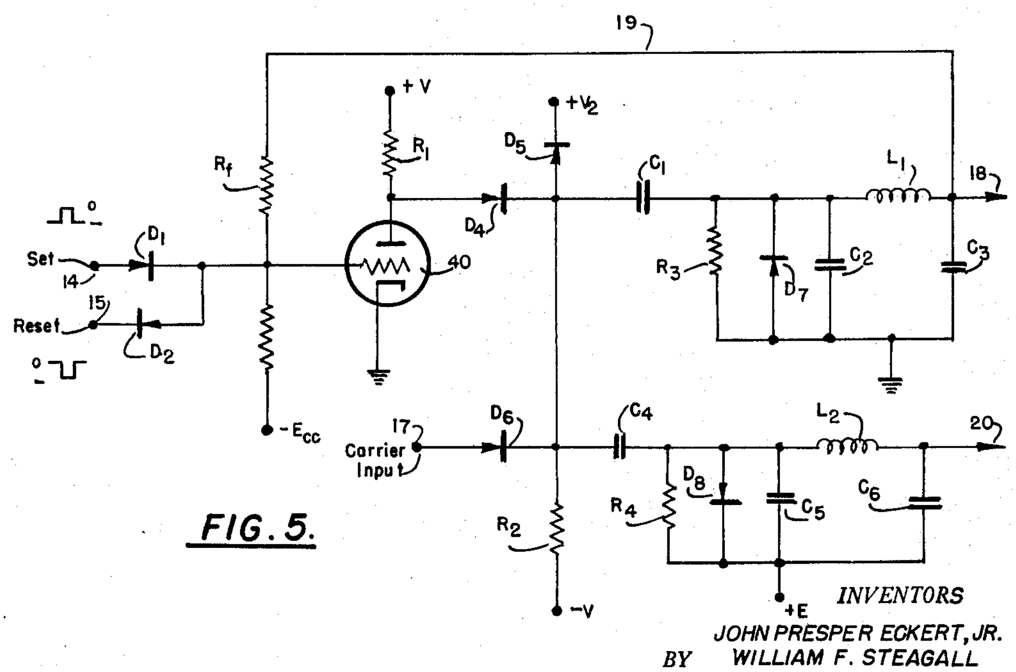
Figure 5 is another modification in accordance with the present invention.

Still another embodiment of the present invention has been shown in Figure 5 and this latter embodiment is functionally similar to the embodiment of Figure 1, however, with the major difference that in place of transistor 10 a vacuum tube 40 is employed. The device of Figure 5 operates in the manner discussed in reference to Figure 1 and, except for the vacuum tube 40, like numerals to those utilized in respect to Figure 1 have been employed in Figure 5.

While preferred embodiments of the present invention have been described, many variations thereof will be suggested to those skilled in the art. In particular, it will be obvious to those skilled in the art that various types of transistors may be employed in the practice of the invention, and that these various types may require supply potentials of different polarities from those hereinabove described, and that they may further require control signals differing in polarity and reference level from those shown hereinabove. It must be understood, therefore, that the foregoing description is meant to be illustrative only and all such variations as are in accord with the principles discussed above are meant to fall within the scope of the appended claims.

Having thus described our invention, we claim:

1. In a bistable device comprising the combination of an input signal source, an alternating signal source having a frequency substantially higher than that of the input signal, switch means having first and second inputs respectively connected to said input and alternating signal sources to receive the signals therefrom and responsive to different values of the signal at said first input for respectively transmitting and not transmitting said alternating signal, means connected to receive the transmitted alternating signal for converting said alternating signal to one of a frequency similar to that of said input signal, amplifier means having gain greater than one, and means for feeding back said converted signal to supply to said switch means a signal of substantially the same value as said input signal, the improvement of said amplifier means being connected between said feed back means and said first input of said switch means to amplify said converted signals and to apply the amplified signals to said first input, and the circuit connections between said switch means and said converting means including only passive circuit elements, whereby said amplifier means transmits only relatively low frequency signals.

2. In a bistable device comprising the combination of an input signal source, an alternating signal source having a frequency substantially higher than that of the input signal, a passive modulator connected to said sources to receive the signals therefrom and responsive to different values of said input signal for respectively transmitting and not transmitting said alternating signal, means connected to receive the transmitted alternating signal for converting said alternating signal to one of a frequency similar to that of said input signal, amplifier means of gain sufficient to maintain said device in a stable state, and means for feeding back said converted signal to supply to said passive modulator a signal of substantially the same value as said input signal, the improvement of said amplifier means being connected between said feed back means and said passive modulator to amplify signals of a frequency similar to that of said input signal and to apply the amplified signals to said passive modulator, and the circuit connections between said passive modulator and said converting means including only passive circuit elements, whereby said amplifier means has applied thereto only relatively low frequency signals.

3. A bistable amplifier system comprising an amplifier operating with gain of greater than one, means for supplying an alternating signal, means for converting said alternating signal to a substantially direct signal, means for feeding back said direct signal to the input of said amplifier to control the output thereof, means for intermittently supplying direct input signals to the input of said amplifier, and means including only passive circuit elements and responsive to different outputs of said amplifier for respectively transmitting and not transmitting said alternating signal to said converting means, whereby only substantially direct signals are applied to said amplifier for amplification.

4. A bistable amplifier system comprising an amplifier of gain greater than one, means for supplying different input signals of relatively low frequency to said amplifier to produce different outputs therefrom, means for supplying an alternating signal of relatively high frequency, means for converting said alternating signal to a signal of relatively low frequency, means for feeding back said converted signal to the input of said amplifier to control the output thereof in the same way as the input signal, and switch means including only passive circuit elements and responsive to the output of said amplifier for transmitting and not transmitting said alternating signal to said converting means, whereby only signals of relatively low frequency are applied to said amplifier.

5. A bistable amplifier system comprising a transistor connected to provide gain greater than one, means for supplying different input signals of relatively low frequency to said transistor to place said transistor in different conductive states, means for supplying an alternating signal of relatively high frequency, means for converting said alternating signal to a substantially direct signal, means for feeding back said direct signal to said transistor to place said transistor in the same state as effected by the input signal and means including only passive circuit elements and responsive to the outputs of said transistor corresponding to said different states for relatively transmitting and not transmitting said alternating signal to said converting means, whereby only signals of relatively low frequency are applied to said transistor.

6. A bistable amplifier system as recited in claim 5 in which said transistor is connected in the common emitter mode, and in which said means for supplying different input signals includes means for supplying reset signals to one of said transistor electrodes, and means for supplying set input signals to another of said transistor electrodes.

7. A bistable amplifier system as recited in claim 4 wherein said switch means includes a semiconductor diode switch.

8. A bistable amplifier system as recited in claim 4 in which the different amplifier outputs are two different potential levels produced in response to said different input signals respectively, and in which said alternating signals of relatively high frequency exhibit regularly occurring potential excursions between said different potential levels.

9. A bistable amplifier system as recited in claim 4 in which said means for converting said alternating signal to a signal of relatively low frequency includes means for producing low frequency signals of opposite polarities.

References Cited in the file of this patent

UNITED STATES PATENTS

| | | |
|---|---|---|
| 2,424,833 | Korman | July 29, 1947 |
| 2,486,776 | Barney | Nov. 1, 1949 |
| 2,535,303 | Lewis | Dec. 26, 1950 |
| 2,597,796 | Hindall | May 20, 1952 |
| 2,601,096 | Creamer et al. | June 17, 1952 |
| 2,670,445 | Felker | Feb. 23, 1954 |
| 2,712,065 | Elbourn et al. | June 28, 1955 |
| 2,718,613 | Harris | Sept. 20, 1955 |
| 2,756,329 | Lubkin | July 24, 1956 |
| 2,759,052 | MacDonald | Aug. 14, 1956 |
| 2,760,160 | Flood et al. | Aug. 21, 1956 |
| 2,795,696 | Evans | June 11, 1957 |

OTHER REFERENCES

Article entitled, "The Transistor Regenerative Amplifier as a Computer Element," The Proc. of the Inst. of Elec. Eng., October 1954, pp. 298–307.